United States Patent [19]

Maenke

[11] Patent Number: 5,253,755
[45] Date of Patent: Oct. 19, 1993

[54] CUSHIONED COVER FOR DISK CONTAINER

[75] Inventor: Dale A. Maenke, Chaska, Minn.
[73] Assignee: Fluoroware, Inc., Chaska, Minn.
[21] Appl. No.: 672,466
[22] Filed: Mar. 20, 1991
[51] Int. Cl.$^5$ ............................................. B65D 85/30
[52] U.S. Cl. ................... 206/444; 206/454; 206/334
[58] Field of Search ............... 206/334, 454, 453, 303, 206/308, 511, 444; 211/40, 41

[56] References Cited

U.S. PATENT DOCUMENTS

| | | | |
|---|---|---|---|
| Re. 33,361 | 10/1990 | Coe | 206/334 |
| 4,043,451 | 8/1977 | Johnson | 206/334 |
| 4,061,228 | 12/1977 | Johnson | 206/454 |
| 4,450,960 | 5/1984 | Johnson | 206/334 |
| 4,520,925 | 6/1985 | Johnson | 206/334 |
| 4,557,382 | 12/1985 | Johnson | 206/444 |
| 4,684,021 | 8/1987 | Niebeling | 206/454 |
| 4,721,207 | 1/1988 | Kikuchi | 206/328 |
| 4,880,116 | 11/1989 | Kos | 206/454 |
| 5,025,926 | 6/1991 | Gregerson et al. | 206/334 |
| 5,046,615 | 9/1991 | Nentl et al. | 206/454 |

OTHER PUBLICATIONS

Exhibit A—Top Cover, 95mm Memory Disk Shipper.
Exhibit B—Disk Shipper Cushions.
Exhibit C—Cover, 100mm Wafer Shipper.
Exhibit D—Cushion.
Exhibit E—Wafer Cushion.
Exhibit F—Disk Shipper Cover, 25 Pitch, 25 Capacity.

*Primary Examiner*—Steven N. Meyers
*Assistant Examiner*—Thomas P. Hilliard
*Attorney, Agent, or Firm*—Palmatier, Sjoquist & Helget

[57] ABSTRACT

A cushioned cover for a wafer carrier having panel portions overlying and closing the top of the carrier and end walls with offsets, closing the U-shaped end walls of the carrier, a removable cushioning device in the cover having a single row of hold down elements mounted on flexible horizontal arms allowing up and down movement of the hold down elements to apply pressure against the edges of the wafers, the mounting arms of adjacent hold down elements being attached to opposite sides of the frame of the cushioning device.

5 Claims, 2 Drawing Sheets

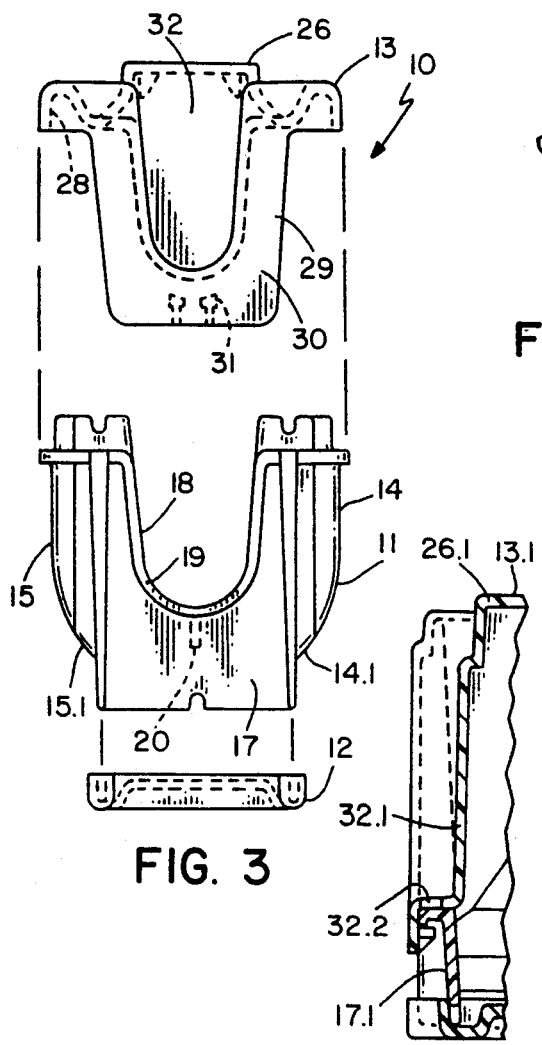
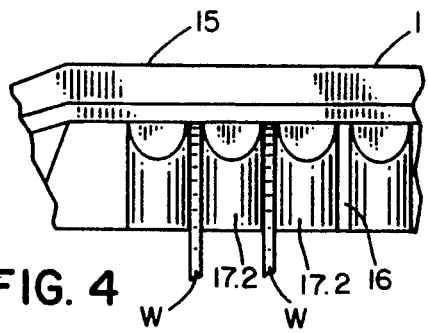
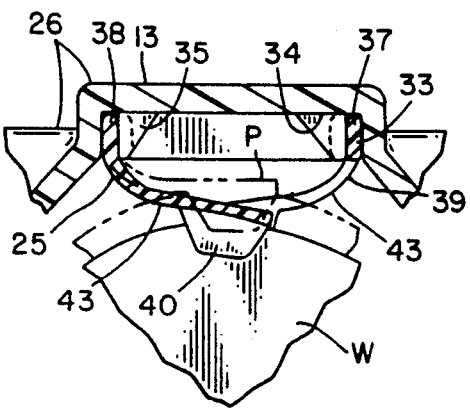
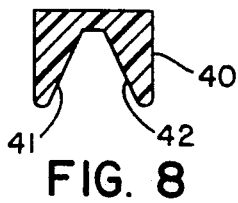
FIG. 3
FIG. 4
FIG. 5
FIG. 9
FIG. 8
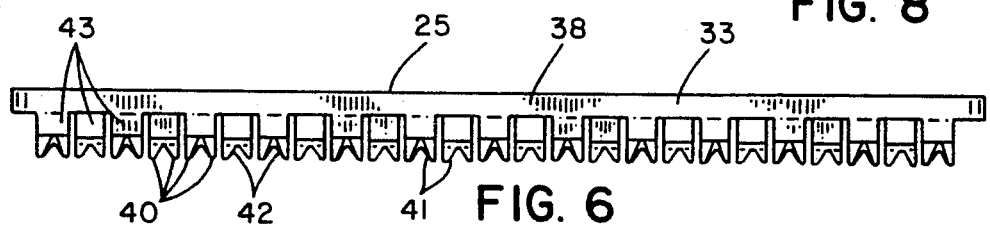
FIG. 6
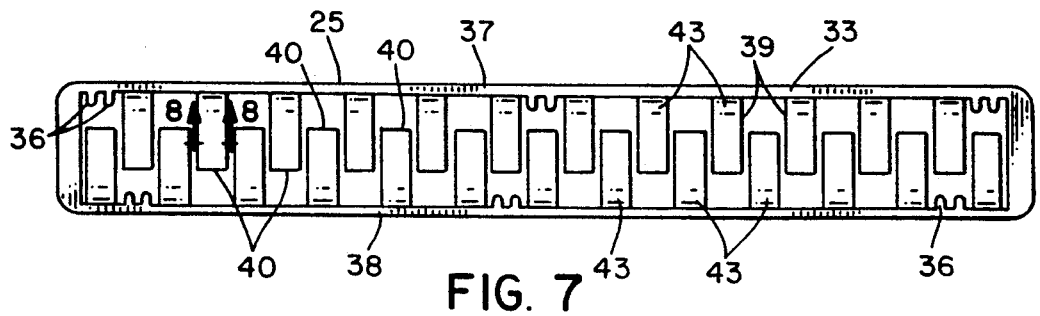
FIG. 7

CUSHIONED COVER FOR DISK CONTAINER

This invention relates to devices for confining memory disks, silicon wafers and the like for transport and storage, and more particularly relates to a protective cover and removable cushion for a storage container for such wafers.

BACKGROUND OF THE INVENTION

The wafers being stored or transported are generally silicon wafers being processed into circuit chips. Wafers of other material such as gallium arsenide are also used for the same purpose. Other wafers are also processed and transported in this manner, such as memory disks, which may be metal with process coating on one side; and also glass substrates with process coatings. Wherever herein the word wafer is used, it is intended to include all of such types of wafers and disks and substrates.

In the storage and transport of such memory disks or wafers, there is always concern for the possibility of breakage and causing damage to the wafers because the wafers, as they are being processed, are quite valuable and breakage occurs relatively easily. The wafers may be on the order of 0.050 inches thickness and may be in the general size range of 48 millimeters diameter, 65 millimeters and larger. At least these smaller wafers are oftentimes contained in wafer carriers which have spacers in the sidewalls to space the wafers from each other; and such wafer carriers have open tops and open bottoms to accommodate processing liquids including rinsing water. Although such wafer carriers might in some instances be confined in a box or container with a cover, it is also convenient in some circumstances to simply apply a cover onto the top of the wafer carrier and onto the bottom of the wafer carrier to fully enclose the wafers for transport and storage. Such covers have been previously known as illustrated in U.S. Pat. No. 4,557,382.

It is important that the wafers remain fairly stationary within the wafer carrier for transport and storage, and accordingly, cushioning devices have been incorporated into the cover as illustrated in the patent mentioned above. Such cushioning devices as the downwardly protruding fingers will generally rub along the edges of the wafers as the cover is applied, which tends to generate particles, causing contamination of the faces of the wafers with such particles.

SUMMARY OF THE INVENTION

An object of the invention is to provide a new and improved cushion for engaging and restricting the movement of memory disks or wafers confined in a storage and shipping container.

Another object of the invention is to produce an improved cover for a disk container or wafer carrier as to enclose the entire top and end walls of the carrier and provide a removable and replaceable cushioning device in the cover and at the centerline of the carrier to bear down on the top centerline of the wafers to engage and restrict movement of the wafers without generating contaminating particles.

A feature of the invention is a cushion for a cover of a disk container or wafer carrier and removably mounted in the carrier to be replaceable as the cover is reused. The cushioning device has cantilever cushioning portions protruding to hold down elements located centrally to bear down on the edges of the disks being stored and transported and wherein the cantilever cushioning portions have substantially horizontally extending mounting arms alternately extending to opposite side portions of the removable frame for resiliently urging the wafer hold down elements against the wafer edges for restricting movement of the wafers in the carrier.

Another feature of the invention is the cover for the disk container or wafer carrier which has a top panel mounting the removable cushion midway between the sides of the wafer carrier; and the cover also has depending end walls to confront and close the U-shaped ends of the wafer carrier. The depending end walls of the cover have offset portions protruding through the U-shaped portions of the carrier end walls. The preferred form of offset in the end walls of the cover are oblique offset portions in the covers for the smaller sized carriers; and the preferred form of offset in the covers for the larger sized carriers are offset uniformly to uniformly protrude through the U-shaped end wall openings of the wafer carriers. The offsets will of course stiffen the cover as a whole and minimize any flexing of the end walls which movably attach to a beaded portion of the carrier end wall. The offsets also make entry of particles into the carrier more difficult.

BRIEF DESCRIPTION OF THE DRAWINGS

FIG. 3 is an end elevation view of the carrier at its lower and upper covers, shown in exploded relationship to each other.

FIG. 4 is an enlarged detail plan view taken approximately at 4—4 of FIG. 2.

FIG. 5 is an enlarged detail section view taken approximately at 5—5 of FIG. 1.

FIG. 6 is a side elevation view of the cushioning device, removed from the cover.

FIG. 7 is a top plan view of the cushion shown in FIG. 6.

FIG. 8 is an enlarged detail section view taken approximately at 8—8 of FIG. 7.

FIG. 9 is a detail section view of the carrier assembled with a modified form of cover.

DETAILED SPECIFICATION

Figure 1:
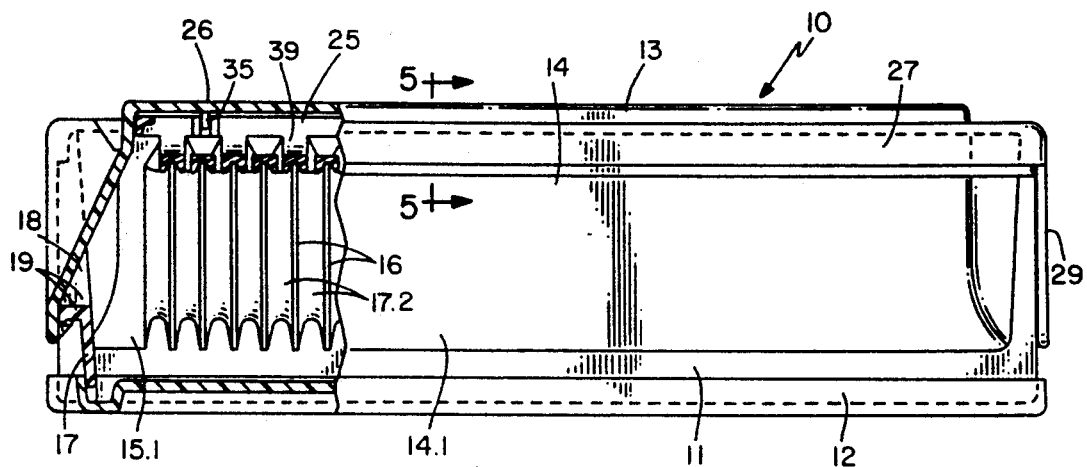
FIG. 1 is a side elevation view of the assembled carrier with its top and bottom covers and having a portion broken away for clarity of detail.

One form of the invention is shown in the drawings and is described herein. The covered shipper for memory disks or wafers of silicon, gallium arsenide, and the like is indicated in general by numeral 10 and includes a wafer carrier 11, a bottom cover 12, and a top cover 13.

The disk container or wafer carrier 11 has sidewalls 14 and 15 having substantially vertical upper portions as seen in FIG. 3 and having curved or rounded lower portions 14.1, 15.1 for supporting such disks or wafers W. The disks or wafers W are seen in FIG. 4 and have their side edges inserted into slots 16 between adjacent spacers or ribs 17.2 which are curved to follow the curvature of the sidewalls at their lower portions 14.1, 15.1. The spacer ribs 17.2 are smoothly rounded so that when the disks or wafers W are inserted into the slots 16, the wafers will be readily and smoothly guided into the slots by the rounded surfaces of the ribs.

The wafer carrier 11 also has end walls 17 which are formed integrally of the sidewalls 14, 15, so that the wafer carrier is entirely in one piece. The end walls are substantially identical to each other, and both have generally U-shaped openings 18 formed therein to provide access to the wafers in the carrier during processing of such wafers. Each of the end walls 17 has a single continuous U-shaped rib, or bead, or flange 19 with a substantial U-shape, following the contour of the opening 18 in the end wall 17.

At one end of the wafer carrier 11, a tab 20 depends from the rib 19, as for indexing the cover 13 into proper position.

It will be recognzied that the wafer carrier 11 has an open top 21 and an open bottom 22 to accommodate flow of fluids, such as cleansing fluids such as water during processing of the wafers. The sidewalls 14 and 15 of the carrier have feet 23 adjacent the open bottom for supporting the carrier when the carrier is placed upon a shelf or table surface.

The cover 12 is formed of a plastic similar to that of the carrier 11, such as polypropylene, polyethylene, or other similar plastics, including fluoropolymers. It will be seen that the bottom cover 12 fits onto the open bottom of the carrier and receives the feet 13 and the bottom edges of the end walls in grooves 24 extending around the entire periphery of the bottom cover 12.

The top cover 13 for the cassette 11 is also molded of a plastic similar to that in the carrier and is of integral and one-piece construction. The protective cover 13 also mounts a removable cushioning device indicated in general by numeral 25 which is located directly above the longitudinal centerline of the carrier 11 so as to engage the upper edges of the wafers adjacent their top center location.

The protective cover 13 has an elongate panel portion 26 extending the full length of the carrier 11 to lie upon the upper edges of the sidewalls 14, 15 of the carrier and to close the open top 21 thereof. The panel portion has side portions which define depending flanges 27, and the panel portion 26 also defines grooves 28 which will receive the upper edges of the sidewalls 14, 15 therein when the cover is fully seated onto the carrier.

The protective cover 13 also has end walls 29 which are formed integrally with and depend from the panel portion 26 to entirely confront and close the U-shaped openings 18 in the end walls 17. The end wall portions 29 have end wall panel portions 30 which are straight sided and generally rectangular in configuration; and the end panel portions 29 have lugs 31 formed on their inner sides to hook over and releasably attach to the U-shaped ribs or beads 19 on the opposite end walls 17 of the carrier.

The end walls 29 also have offsets or offset portions 32 which are generally U-shaped to conform to the U-shaped opening 18 in the end walls of the carrier 11. In the form of the invention illustrated in FIGS. 1–3, the offset 32 comprises a panel which is obliquely oriented with respect to the end wall panel 30 so that the offset portion 32 progressively varies in the amount that the offset protrudes into the U-shaped opening 18 of the carrier end wall.

Alternately, the offset may be differently shaped, as illustrated in FIG. 9, wherein the offset 32.1 forms a step or shoulder 32.2 which follows the contour of the U-shaped opening 18 in the end walls of the wafer carrier. The stepped offset of FIG. 9 minimizes entry of contaminate particles into the wafer carrier. Similarly, the oblique offset 32 of FIGS. 1–3 also minimizes particulate offset migration into the carrier and also facilitates ready and easy washing and drying of the cover 13 after use.

Figure 2:
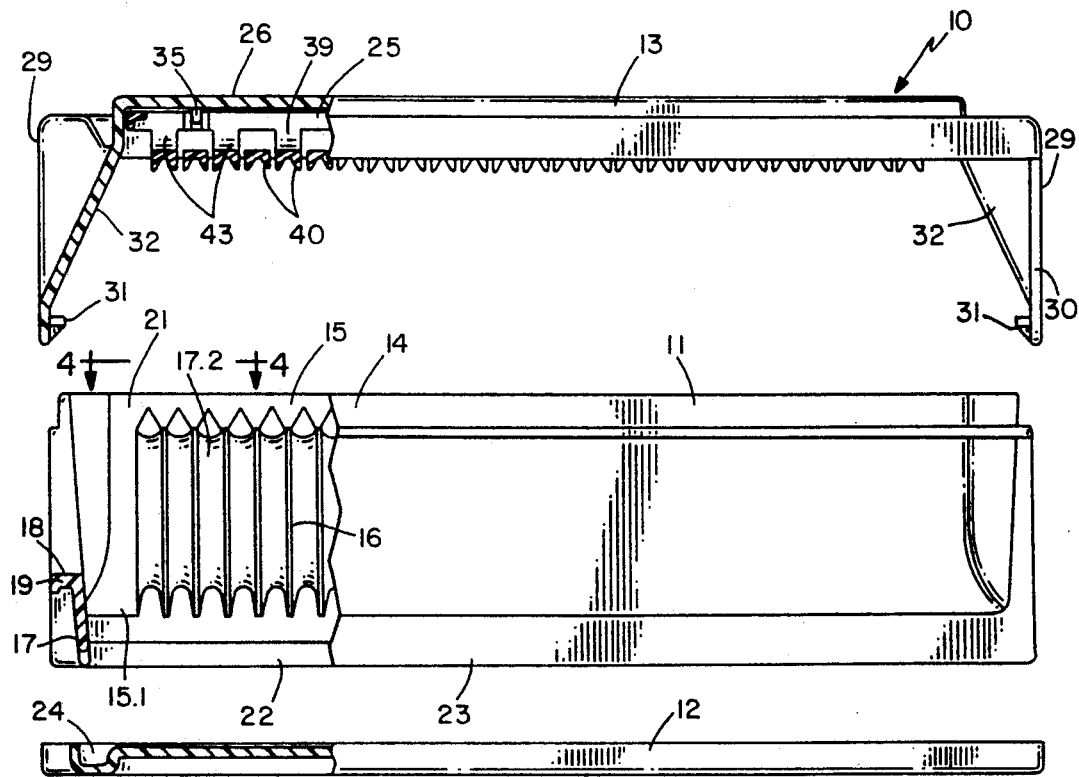
FIG. 2 is an exploded side elevation view of the wafer carrier with bottom and top covers, all being broken away for clarity of detail.

The alternate form of cover 13.1 illustrated in FIG. 9 also has a panel portion 26.1 similar to the panel portion 26 of FIGS. 1–3.

The protective cover 13 also mounts or carries the cushioning device, indicated in general by numeral 25. The cushioning device 25 has an elongate frame 33 shaped as a rectangular annulus. The frame 33 of the cushioning device is received into and carried in a recess or socket 34 formed in the panel portion 26 of the cover. The panel portion 26 defines a number of small tabs or inserts 35 which are received into and gripped by gripping tabs 36 formed on the side portions 37, 38 of the rectangular frame 33 of the cushioning device 25. The tabs 35 and 36 fit into each other for precisely positioning the cushioning device 25 in the cover 13 so that the cushion functions in respect to each of the disks or wafers W which will be in the several slots 16 between the spacers 17.2.

The cushioning device has a multiplicity of cantilever shaped wafer cushioning portions 39 which extend transversely of the frame 33 and of the elongate panel portion 26 of the cover. The wafer cushioning portions 39 have a multiplicity of elongate wafer hold down elements 40 arranged in a single row along the elongate frame 33 approximately midway between the opposite side portions 37, 38 thereof. The hold down elements have wafer engaging faces 41 which are grooved as seen at 42 in FIGS. 6 and 8.

Accordingly, it will be recognized, as seen in FIG. 5 that each of the individual wafer hold down elements 40 will engage a single wafer, bearing against the rounded upper edge of the wafer to hold the wafer against both up and down movement and transverse movement.

The wafer cushioning portions 39 also include a multiplicity of elongate resiliently flexible mounting arms 43 which are formed integrally of the sidewalls 37, 38 of the frame. It will be recognized that alternate mounting arms 43 are attached to opposite side portions 37, 38 of the frame, i.e., the mounting arms of adjacent hold down elements 40 are attached to opposite sides of the frame.

As best seen in FIG. 5, the mounting arms are formed integrally of the hold down elements, and portions of the hold down arms extend generally horizontally adjacent the hold down elements 40. FIG. 5 illustrates, in full lines, the shape of the resiliently yieldable mounting arms 43 in their relaxed condition, and it will be recognized that when the cover 13 is pressed down onto the wafer carrier in the position illustrated in FIG. 1, the wafers W and the hold down elements 40 will bear against each other and the wafers will push the hold down elements upwardly into the dotted line position P so that the adjacent portions of the mounting arms 43 will be in substantially horizontal position.

The hold down elements and the adjacent portions of the mounting arms may move toward and away from the panel portion 26 of the cover as the cover is pressed down onto the wafer carrier and then removed from it, so as to tightly retain and subsequently release the wafers in the carrier.

Recognizing that the size and shape of the wafers, particularly at the particular location at which the hold down elements 40 engage the wafer, are not all the same, it is important that the hold down elements be free to move up and down against the resilient flexing of the mounting arms 43. Oftentimes, wafers W will have a flat spot or area at one portion of the peripheral edge, and accordingly, if the hold down element engages such a flattened edge area of the wafer, it must be free to move against the wafer and retain the wafer in this condition.

It will be seen that the present invention provides a cover for a disk container or wafer carrier for transporting and storing disks or wafers wherein the cover has end panels to close the U-shaped open ends of the carrier and wherein a cushioning device is removably mounted on the cover and has a single row of hold down elements above the center of the disks or wafers in the container or carrier and approximately midway between the sides of the frame of the cushioning device. The hold down elements are mounted on resiliently flexible mounting arms, and alternate arms are attached to opposite sides of the elongate frame so that adjacent hold down elements are connected to opposite sides of the frame. The hold down elements are free to oscillate in an up and down direction, at the centerline of the wafer, so as to apply pressure onto the disk or wafer and assume their retaining position without sliding along the edge of the disk or wafer so as to minimize any possibility of generating particulate which would otherwise contaminate the faces of the disks or wafers.

The present invention may be embodied in other specific forms without departing from the spirit or essential attributes thereof, and it is therefore desired that the present emobdiment be considered in all respects as illustrative and not restrictive, reference being made to the appended claims rather than to the foregoing description to indicate the scope of the invention.

I claim:

1. A protective cover and an elongate disk container portion receiving said cover thereon, said container portion comprising sidewall portions, an open disk storing interior portion between the sidewall portions, an open top portion of said interior portion, and disk confining rib and slot portions formed in the sidewall portions, a plurality of disks stored in a row in said interior portion of the container portion, said disks comprising side edge portions confined by said rib and slot portions and said disks comprising rounded upper edge portions disposed adjacent the open top portion along a row substantially midway between the sidewall portions, said protective cover comprising an elongate panel portion overlying and substantially closing the open top portion of the container portion, the panel portion having opposite elongate side portions adjacent the sidewall portions of the container portion, and a multiplicity of elongate cantilever disk cushioning portions comprising inner end portions having disk hold down elements thereon and aligned with each other in and along a row substantially midway between the sidewall portions of the container portion and also substantially midway between the side portions of the panel portion to confront the row of disk rounded upper edge portions adjacent to said open top portion, the hold down elements comprising disk engaging faces engaging the disk rounded upper edge portions, said hold down elements being resiliently yieldable toward the panel portion, the elongate cantilever disk cushioning portions comprising resiliently yielded mounting arms and also comprising outer end portions rigidly secured to the panel portion, the mounting arms of adjacent cushioning portions extend in opposite directions toward the row of hold down elements.

2. A protective cover and an elongate disk container portion receiving said protective cover thereon, said container portion comprising sidewall portions, an open disk storing interior portion between the sidewall portions, an open top portion of said interior portion, and disk confining rib and slot portions formed in the sidewall portions, a plurality of disks stored in a row in said interior portion of the container portion, said disks comprising side edge portions confined by said rib and slot portions and said disks comprising rounded upper edge portions disposed adjacent the open top portion along a row substantially midway between the sidewall portions, said protective cover comprising an elongate panel portion overlying and substantially closing the open top portion of the container portion, the panel portion having opposite elongate side portions adjacent the sidewall portions of the container portion, and a multiplicity of elongate cantilever disk cushioning portions comprising inner and end portions having disk hold down elements thereon and aligned with each other in and along a row substantially midway between the side portions of the panel portion and substantially midway between the sidewall portions of the container portion to confront the row of disk rounded upper edge portions of the disks adjacent to said open top portion, the hold down elements comprising disk engaging faces engaging the disk rounded upper edge portions, said hold down elements being resiliently yieldable toward the panel portion, the elongate cantilever disk cushioning portions comprising resiliently yieldable mounting arms and also comprising outer end portions rigidly secured to the panel portion of the protective cover, each of the disk cushioning portions comprising a single flexible mounting arm portion rigidly connected with a single one of said hold down elements and also rigidly connected to the panel portion and each mounting arm portion extending across the panel portion from one of the side portions of the panel portion and to the corresponding hold down element, the hold down elements being moveable toward and away from the panel portion, and the disk cushioning portions also comprising an elongate frame removably mounted on the panel portion, the frame comprising opposite side portions, the mounting arms of adjacent cushioning portions extending in opposite directions and are attached to opposite side portions of the frame.

3. A protective cover and an elongate disk container portion receiving said cover thereon, said disk container portion comprising sidewall portions, an open disk storing interior portion between the sidewall portions, an open top portion of said interior portion, an end wall portion extending between and affixed to the sidewall portions, the end wall portion comprising a U-shaped opening therein and communicating with the open interior portions, and disk confining rib and slot portions formed in the sidewall portions, a plurality of disks stored in a row in said interior portions, said disks comprising side edge portions confined by said rib and slot portions and said disks comprising rounded upper edge portions also disposed adjacent the open top portion along a row substantially midway between the sidewall portions, said protective cover comprising and elongate top panel portion overlying and substantially closing the open top portion of the container portion, and an end cover portion rigidly affixed to the top panel portion and depending therefrom and the end cover portion confronting the end wall portion of the disk container portion, the end cover portion comprising an end wall panel portion oriented substantially normal to the top panel portion and depending therefrom and the end wall panel portion confronting the end wall portion of the disk container portion, the end cover portion also comprising a U-shaped offset panel portion formed integrally with and extending to said top wall portion at a location spaced from said end wall panel portion, said U-shaped offset panel portion substantially conforming to the shape of said U-shaped opening in the end wall portion of the disk container portion, and said U-shaped offset panel portion extending into the open disk storing interior portion of the container portion and confronting the disks therein, said top panel portion also comprising yieldable disk cushioning portion engaging and limiting movement of the rounded upper edge portions of said disks in the interior portion of the disk container.

4. A protective cover according to claim 3 wherein said offset panel portion is obliquely oriented relative to said end wall panel portion and to extend in progressively varying amounts through the end wall portion of the disk container portion.

5. A protective cover according to claim 3 wherein the end wall portion of said disk container portion comprises a lip portion adjacent to said U-shaped opening, the end cover portion comprises a latching lug engaging and removably attached to said lip portion of the end wall portion.

* * * * *